United States Patent [19]

Matsuo et al.

[11] Patent Number: 5,241,201
[45] Date of Patent: Aug. 31, 1993

[54] DRAM WITH CONCENTRIC ADJACENT CAPACITORS

[75] Inventors: Naoto Matsuo, Ibaragi; Shozo Okada, Kobe; Susumu Matsumoto, Hirakata; Yoshiro Nakata, Ikoma; Toshiki Yabu, Hirakata, all of Japan

[73] Assignee: Matsushita Electric Industrial Co., Ltd., Osaka, Japan

[21] Appl. No.: 678,150

[22] Filed: Apr. 2, 1991

[30] Foreign Application Priority Data

Apr. 2, 1990 [JP] Japan .................................. 2-87946

[51] Int. Cl.$^5$ ........................................ H01L 27/108
[52] U.S. Cl. .................................... 257/309; 257/307
[58] Field of Search ............... 357/23.6; 257/307, 309; 365/149

[56] References Cited

U.S. PATENT DOCUMENTS

| 4,958,318 | 9/1990 | Harari | 357/23.6 R |
| 4,985,718 | 1/1991 | Ishijima | 357/23.6 R |
| 5,072,270 | 12/1991 | Nishimura | 357/23.6 R |

Primary Examiner—William D. Larkins
Attorney, Agent, or Firm—Wenderoth, Lind & Ponack

[57] ABSTRACT

A new semiconductor memory device for performing a read/write of information of randomly accessed address includes a plurality of memory cells put in parallel arrays. Each memory cell includes a switching transistor region and a capacitor region. The capacitor regions of the two adjacent memory cells are formed in a common region over the switching transistor region of the two adjacent memory cells. The charge storage electrode of the capacitor region has the shape of a loop. The charge storage electrodes are formed by using self-alignment.

4 Claims, 13 Drawing Sheets

DRAM WITH CONCENTRIC ADJACENT CAPACITORS

BACKGROUND OF THE INVENTION

1. Field of the Invention

The present invention relates to a semiconductor memory device and a manufacturing method thereof.

2. Description of Related Art

A memory cell of a dynamic random access memory (DRAM) is composed of a capacitor region for storing charges and a transistor region for controlling a read and a write of information by the application of a gate electric voltage to the transistor region in order to govern the charges.

The memory capacity of the DRAM is required to increase more and more, and it has been demanded to further decrease the area of the memory cell and the size of capacitor region.

Among high density DRAMs, there are known a stack type DRAM and a trench type DRAM. In a stack type DRAM, a capacitor region is formed in an interlayer portion or in a side wall portion above the transistor region, while in a trench type DRAM, a capacitor region is formed in a trench side-wall formed in a silicon substrate, in order to get a capacitance value above a certain level. Refer for an example to H. Watanabe et al.: Stacked Capacitor Cell for High-Density Dynamic RAMs, IEDM Dig. of Tech. Papers p600(1988).

However, in the stack-type DRAM, as the area of the memory cell decreases, the area of the interlayer portion and the side wall portion forming the capacitor region also decreases so that the capacitance value becomes small. It may be possible to decrease the thickness of the capacitor insulating film or to use an insulating film of high dielectric constant for the capacitor region. However, these solutions cannot be adopted at present due to unreliability. On the other hand, in the trench-type DRAM, the capacitance value can be increased by deepening the trench. However, it is difficult to form a deep trench uniformly.

SUMMARY OF THE INVENTION

An essential object of the present invention is to provide a semiconductor memory cell wherein a higher density of memory cells is realized while keeping an ordinary capacitance value and to provide a manufacturing method of the semiconductor memory cell.

In a semiconductor memory device according to the present invention for performing a read/write of information of randomly accessed address, which semiconductor memory device includes a plurality of memory cells put in parallel arrays, each memory cell comprises a switching transistor region formed on a substrate, including a gate electrode region connected to a word line, a drain electrode region connected to a bit line and a source electrode region. A capacitor region for stores information charges, which capacitor region has a charge storage electrode connected to the source electrode region through a contact, the charge storage electrode extending perpendicular to the surface of the substrate. The two capacitor regions of two adjacent memory cells are formed in a common region over the switching transistor regions of the two adjacent memory cells.

A method according to the present invention, for manufacturing a semiconductor memory device composed of a plurality of memory cells, each memory cell being composed of a switching transistor part and a capacitor part, comprises the steps of forming a switching transistor part on a substrate, which transistor part includes a gate electrode region connected to a word line, a drain electrode region connected to a bit line and a source electrode region. The switching transistor part is successively covered with an interlayer film and an insulator film, forming contact holes extending through the insulator film and the interlayer film to the source electrode with dry etching. A first polycrystalline silicon is deposited over the entire surface, including the contact holes. Trenches for forming charge storage electrodes are formed in a first oxide film deposited over the entire surface. Side walls of a first polycrystalline silicon are formed on the surface of the trenches with dry etching after the first polycrystalline silicon is deposited on the entire surface.

The first oxide film is removed by wet etching. A second oxide film is formed inside the wall which has been made of the first polycrystalline silicon and on the outer surface of the wall by depositing the second oxide film over the entire surface and by performing anisotropic dry etching of the second oxide film. A second charge storage electrode of a polycrystalline silicon layer is formed on the oxide film formed on the outer surface of the wall by depositing a third polycrystalline layer and by performing anisotropic dry etching of the third polycrystalline layer. The second oxide film existing in a region between the first and second electrodes and in a region inside the first charge storage electrode is removed. The first and second storage electrode are isolated by removing the first polycrystalline silicon existing at the bottom of a region inside the first charge storage region and of a region between the first and second charge storage regions. A capacitor oxide film is formed on the first and second charge storage capacitor region, and a plate electrode is formed on the capacitor oxide film.

It is an advantage of the semiconductor memory device according to the present invention that a larger capacitance value can be obtained even if the area in a plane of the memory cell is kept the same as that of a prior art device. For example a large capacitance value ($Cs = 41$ fF/18 $\mu m^2$ area) is realized with a small height of capacitor region of 0.5 $\mu m$.

It is an advantage of the method according to the present invention in that the above-mentioned new semiconductor memory device can be formed with the use of self-alignment.

BRIEF DESCRIPTION OF THE DRAWINGS

The above and other objects and advantages of the present invention will become clear from the following description taken in conjunction with a preferred embodiment thereof, and with reference to the accompanying drawings, in which.

DETAILED DESCRIPTION OF THE PREFERRED EMBODIMENT

Figure 1A:
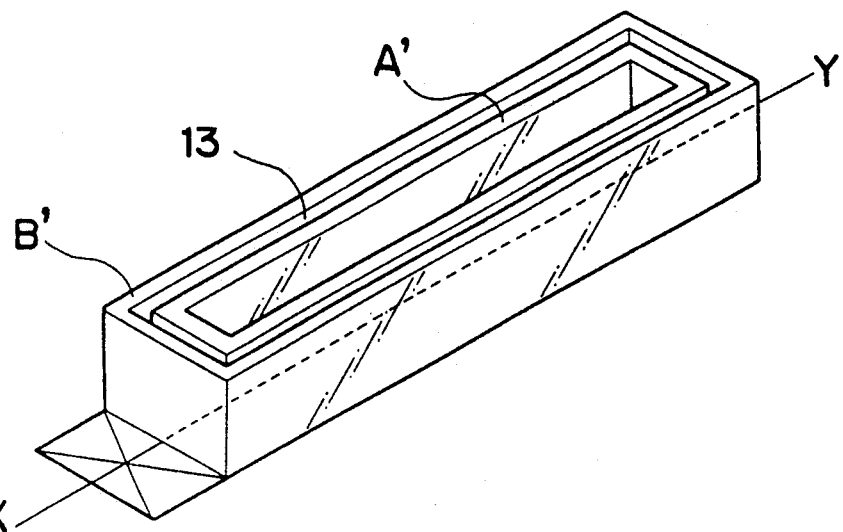
FIG. 1(a) is a perspective view of two adjacent memory cells.
Figure 1B:
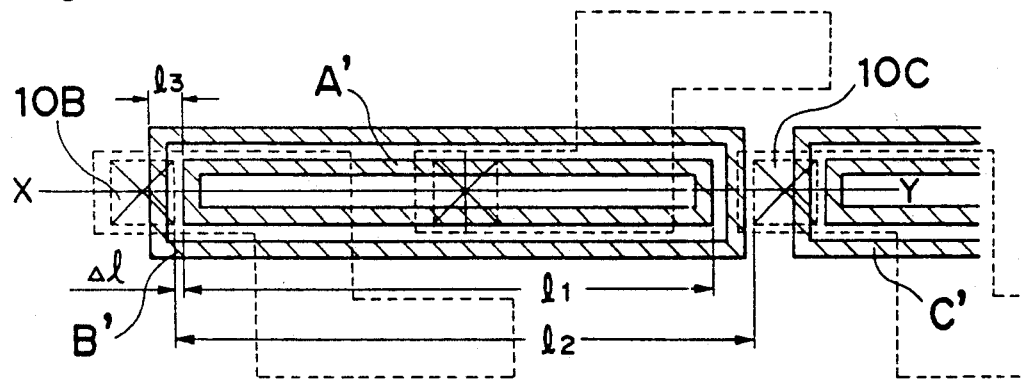
FIG. 1(b) is a plan view of the structure shown in FIG. 1(a)
Figure 1C:
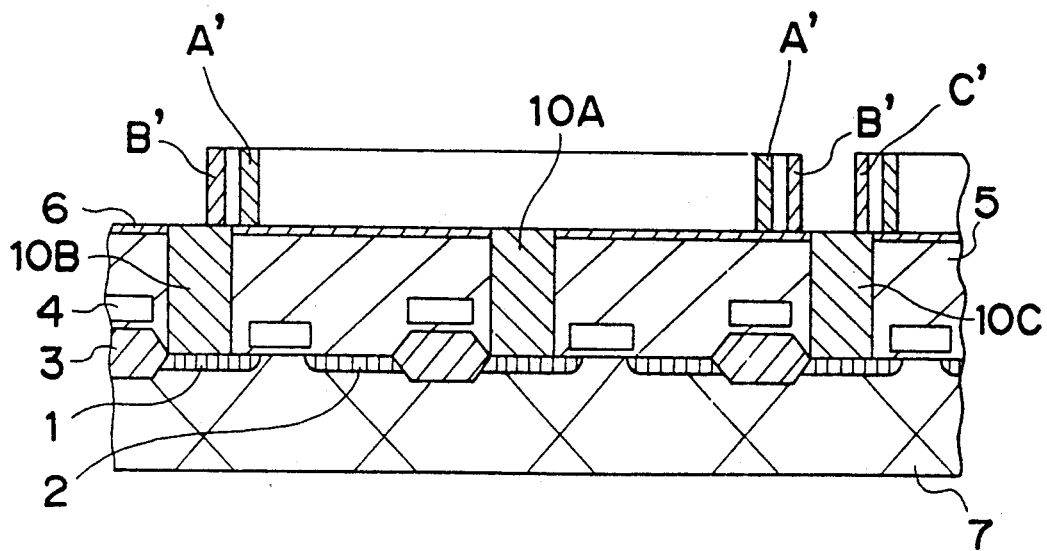
FIG. 1(c) is a sectional view along the X-Y line in FIG. 1(b)

FIGS. 1(a)-1(c) and FIG. 2 show the structure of a memory cell of an embodiment according to the present invention, wherein FIG. 1(a) is a perspective view of two charge storage electrodes A' and B' of two adjacent memory cells A and B, FIG. 1(b) is a plan view of the structure shown in FIG. 1(a), and FIG. 1(c) is a sectional view along the X-Y line in FIG. 1(b). In FIG. 1(b) (and in FIG. 2), areas enclosed by dashed lines designate active areas wherein electric current flows, while X marks designate connecting areas (contact) of the charge storage electrodes A' and B' to source electrodes 1.

In FIGS. 1(a)-(c), two memory cells A and B are shown, and in each memory cell a switching transistor composed of a source electrode 1, a drain electrode 2 and a gate electrode (word line) 4 is formed on a substrate 7. Each element is separated from the others by an element separation film 3. An interlayer film 5 and a silicon nitride film 6 are formed successively on the switching transistors. Though not shown explicitly in FIGS. 1(a)-(c), bit lines are also formed so as to make contact with the active area. The structure of the transistor region explained above is previously known, and a detailed explanation is omitted here. On the other hand, the structure of capacitor region to be explained below is novel and not known in the prior art.

Figure 3:
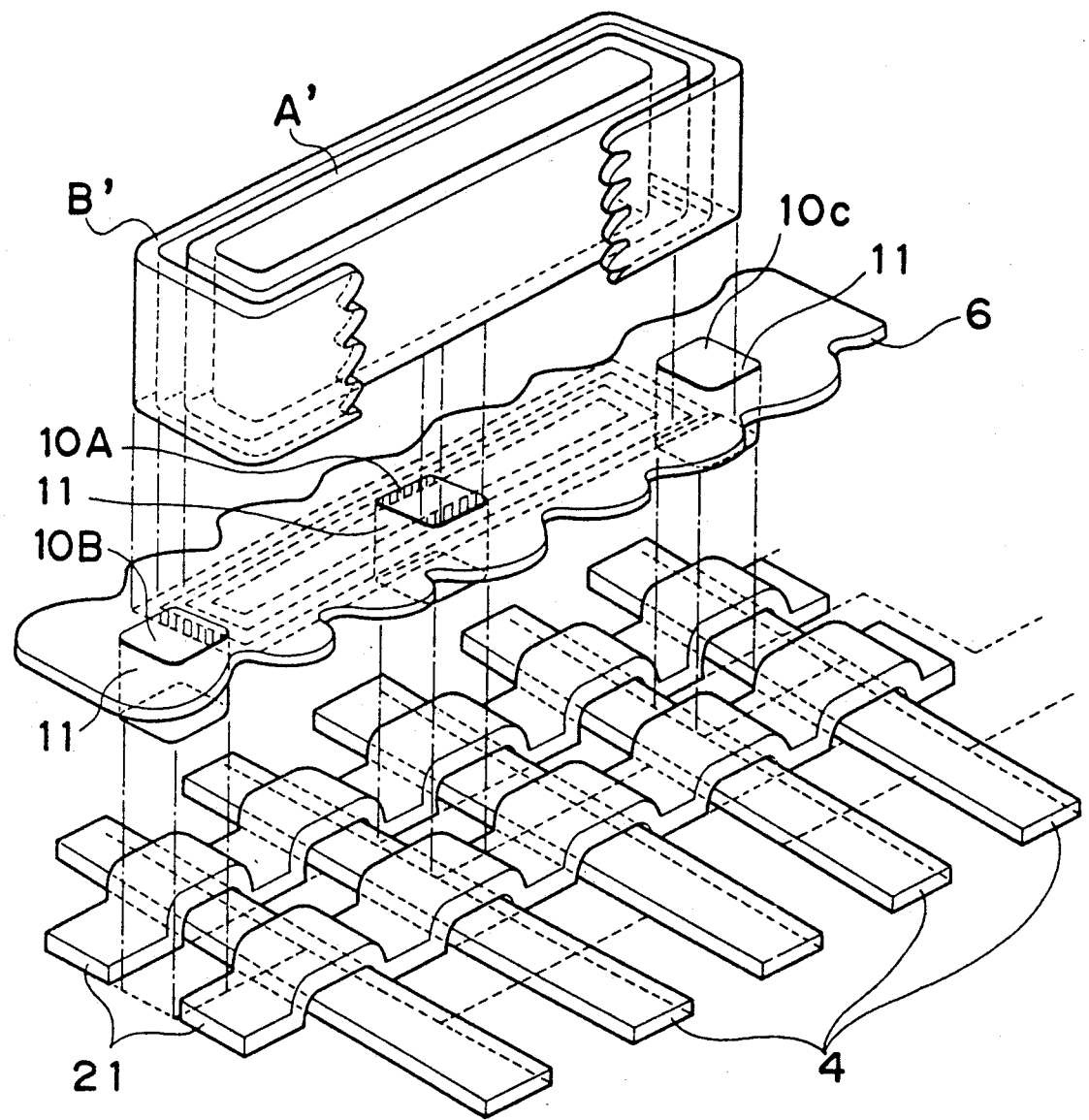
FIG. 3 is an exploded view of a semiconductor memory device as shown in FIGS. 1(a)-1(c)

In order to secure the capacitance required for a memory cell, each capacitor of the two adjacent memory cells A and B shares a common region above the switching transistors of the two adjacent memory cells. The wide electrode planes of both charge storage electrodes A' and B' are extended perpendicular to the surface of the substrate and in parallel each other. To be concrete, the charge storage electrode A' forms an inner wall loop, while the charge storage electrode B' forms an outer wall loop enclosing the inner wall loop. The two charge storage electrodes A' and B' are displayed to have rectangular loops. However, as shown in FIG. 3, the edges of the loops become rounded in the manufacturing process. The charge storage electrode A' and B' are connected via contacts 10A and 10B to the source electrode 1 of the memory cells A and B, respectively.

In FIGS. 1(b) and (c), a charge storage electrode C' belongs to a memory cell C adjacent to the memory cell A, and the charge storage electrode C' is connected through a contact 10C to the source electrode 1 of the memory cell C.

In the structure shown in FIGS. 1(a)-1(c), the thickness of an interlayer film and the thickness of a charge storage electrode film of the electrode B' are determined so that the photolithography overlay precision on forming a trench 13 on forming the charge storage electrode A' (refer to FIGS. 6(a) and (b)) is larger than l3−Δl, as will be explained later in detail.

Figure 2:
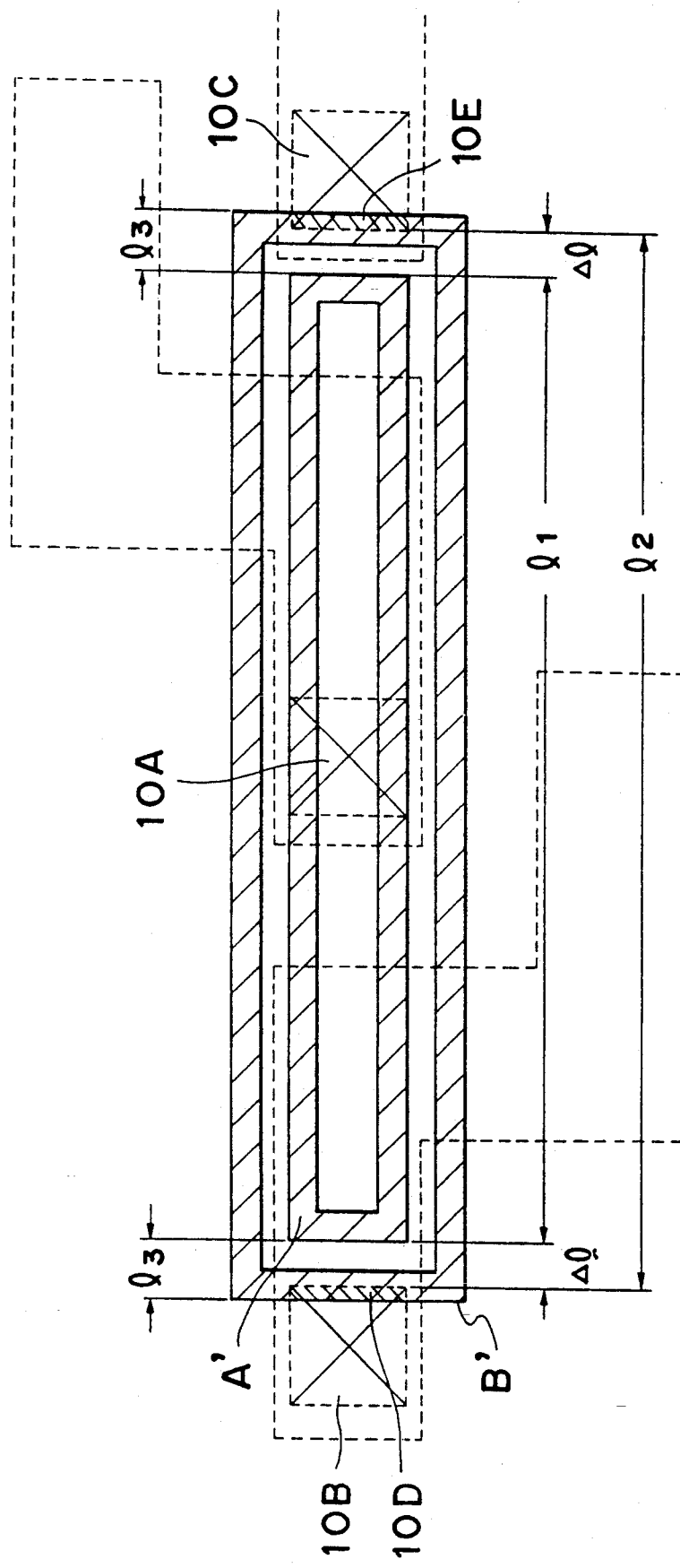
FIG. 2 is a schematic view for explaining the self-alignment of memory cells of the embodiment shown in FIGS. 1(a)-1(c)

FIG. 2 is a schematic view the showing the self-alignment of the memory cell of this embodiment, wherein the charge storage electrode A' is connected to a contact 10A, while the charge storage electrode B' is connected to a contact 10B. After a trench 13 is formed in an oxide film, the charge storage electrode A' is formed on the inner surface of the trench. Further, the charge storage electrode B' is formed on the basis of the charge storage electrode A' (refer to FIG. 6(f)).

In the layout shown in FIG. 2, the overlay of photolithography on forming the trench 13 is taken as zero for simplicity of explanation. In other words, the charge storage electrode B' is connected to both contacts 10B and 10C evenly; the distance Δl between the charge storage electrode A' and the contact 10B is equal to the distance between the charge storage electrode A' and the contact 10C; the two hatched areas 10D and 10E shown in FIG. 2 display the connection regions between the charge storage electrode B' and the contacts 10B and 10C.

Figure 6A:
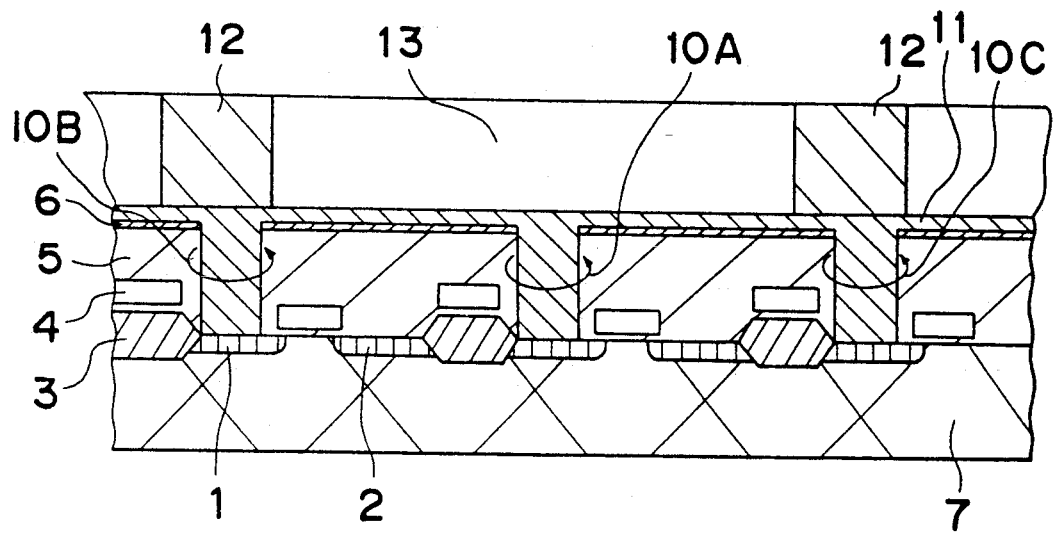
FIGS. 6(a)-6(j) are schematic drawings showing the steps of manufacturing a semiconductor memory device.
Figure 6B:
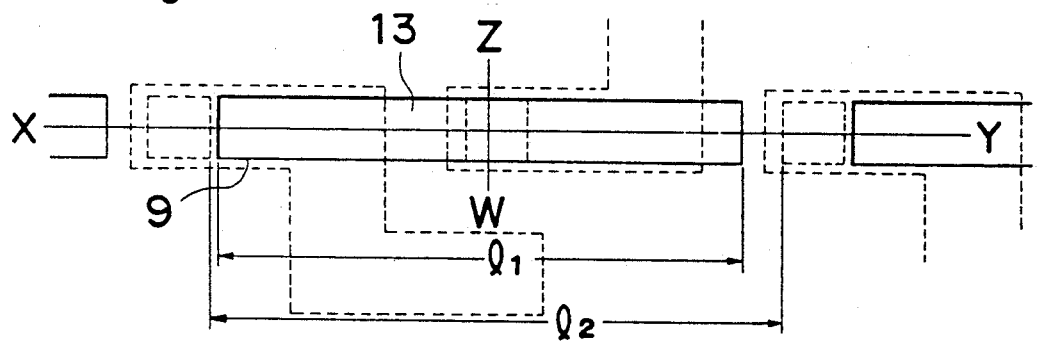
Figure 6C:
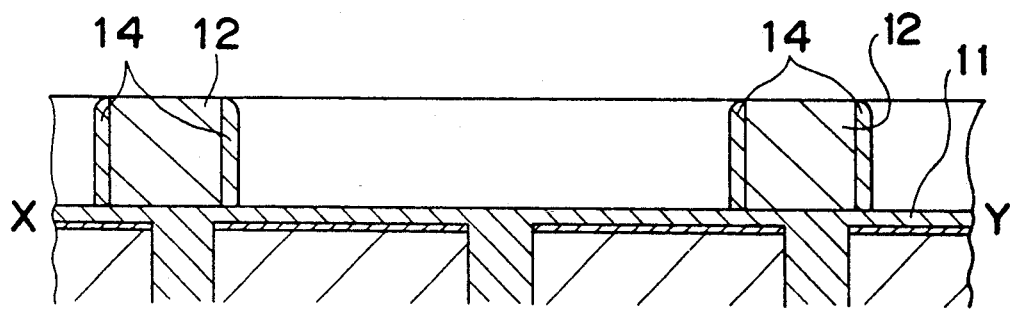
Figure 6D:
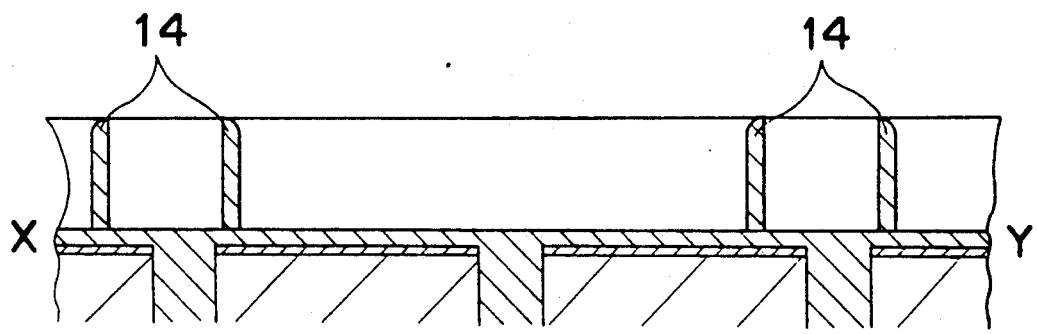
Figure 6E:
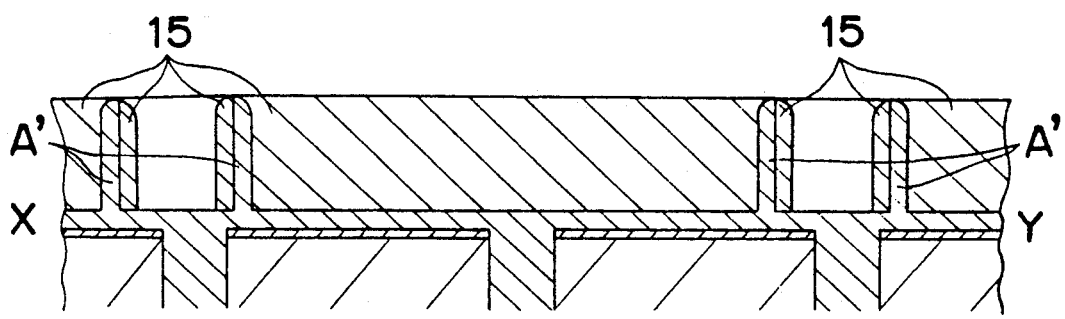

The length l1 of the charge storage electrode A' in the plane is determined so as to increase the capacitance value. The length l1 satisfies the following relations:

$$l1 + 2^*\Delta L \leq l2, \tag{1}$$

and $$l1 + 2^*l3 \geq l2, \tag{2}$$

or $$l2 - 2^*l3 \leq l1 \leq l2 - 2^*\Delta L, \tag{3}$$

wherein l2 is the distance between the two contacts 10B and 10C, which is determined by the size of design (if the cell area is designed to be 1.8 μm², l2 is 3.6 μm), ΔL is the precision of overlay of photolithography on forming a trench, and l3 is the sum of the thickness of an interlayer insulating film 15 (FIG. 6(e)) between the charge storage electrodes A' and B' and the thickness of a film 16 (FIG. 6 (f)) of the charge storage electrode B'. The relation (1) is required so as not to make the charge storage electrode A' contact with the contact 10B or 10C. The relation (2) is required so as to make the charge storage electrode B' contact with the contact 10B or 10C. The relation (3) on a range of the length l1 in a plane of the charge storage electrode A' is derived from the two relations (1) and (2). If the thickness of the interlayer insulating film between the charge storage electrodes A' and B', the thickness of the charge storage electrode B' and ΔL are taken as 0.1, 0.05 and 0.1 μm, respectively, or l3=0.15 μm, then 3.3 μm<l1<3.4 μm.

The length l1 can be increased by making the thickness of the interlayer insulating film and that of the charge storage electrode film 16 (B') smaller or by decreasing the precision ΔL of the overlay of photolithography on forming a trench.

On forming a trench, if the overlay of photolithography is (l3−Δl) or more, the contact in the side wall can be formed with the self-alignment, and the number of the steps of photolithography is not increased. For example, if l3 is taken as 3.35 μm, (l3−Δl) is 0.025 μm. If l1 is increased in the above-mentioned range and the thickness of the interlayer insulating film 15 and the charge storage electrode film 16 are made smaller, (l3−Δl) can be made smaller.

It is considered difficult to decrease the precision ΔL of the overlay below a certain value because of the bow of the wafer inherent in the wafer or induced in the process. The concept of self-alignment becomes effective when l1 is increased in the above-mentioned range and (l3−Δl) is made to be the precision of overlay or less by making the thicknesses of the interlayer insulating film 15 and the charge storage electrode film 16 (B') smaller.

FIG. 3 shows an exploded view of the structure of the memory cell in the case of overlay precision of photolithography larger than l3−Δl. The charge storage electrode B' is shown with a part broken away in order to reveal clearly the relation between the neighboring two electrodes A' and B'. FIG. 3 is drawn in three layers; a layer including the word lines 4 and bit lines 21, a layer including a polycrystalline silicon layer 11 connecting the charge storage electrodes A' and B' to the substrate 7 and a silicon nitride layer 6 as an etching stopper to separate the electrodes A' and B', and a layer of the charge storage electrodes A' and B'. The charge storage electrode A' makes contact with the polycrystalline silicon 11 at the contact 10A through the silicon nitride layer 6, while the charge storage electrode B' makes contact with the polycrystalline silicon 11 at the contact 10B.

Figure 4A:
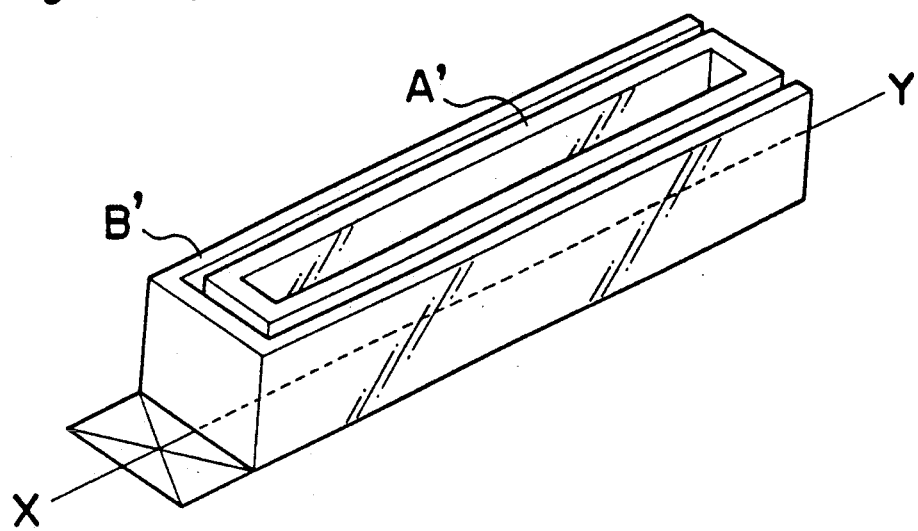
FIG. 4(a) is a perspective view of two adjacent memory cells.
Figure 4B:
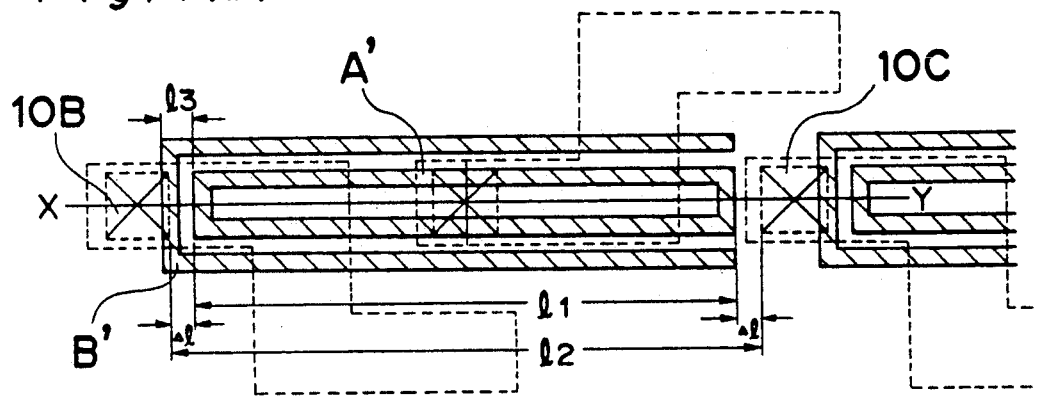
FIG. 4(b) is a plan view of the structure shown in FIG. 4(a)
Figure 4C:
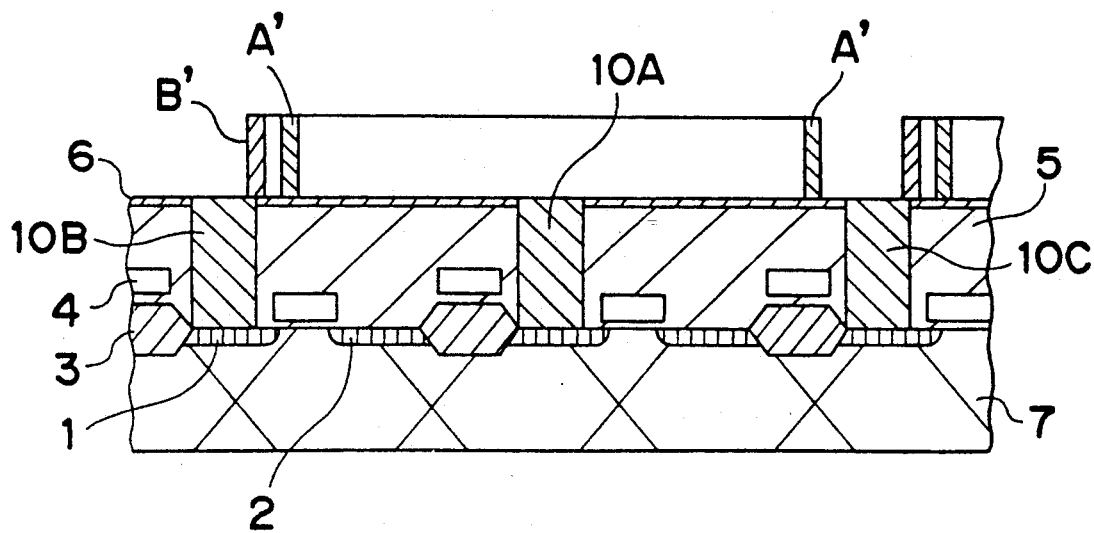
FIG. 4(c) is a sectional view along the X-Y line in FIG. 4(b)

FIGS. 4(a)-(c) show the structure of the semiconductor memory cell in the case that the precision of overlay in photolithography is {l3−(l2−l1)/2} or less, wherein FIG. 4(a) shows a perspective view of the charge storage electrode A' and B' of two adjacent memory cells A and B, FIG. 4(b) shows a plan view of the memory cells and FIG. 4(c) shows a sectional view along the X-Y line in FIG. 4(b). In FIG. 4(b) areas enclosed by dashed lines designate active areas, while X marks designate connecting areas of the charge storage electrodes A' and B' to the source electrodes 1. In these Figures, the overlay in photolithography is taken as zero, and the distance between the charge storage electrode A' and the contact 10B and 10C is Δl. In this condition, it is necessary to remove a region connecting the charge storage electrode B' and the contact 10B or 10C in order to avoid the connection between the charge storage electrode B' and the two contact 10B and 10C. Thus, in the case shown in FIGS. 4(a)-4(c) the regions connecting the charge storage electrodes B' to the contact 10C is removed, and the shape of the charge storage electrode B' is not rectangular, in contrast with the case shown in FIGS. 1(a)-1(c).

As explained above, an advantage of the structure of the memory cell is that the charge storage electrodes can be made by using self-alignment if the thicknesses of interlayer insulating film 15 between the electrodes and the charge storage electrode film 16 is such that the precision of overlay in photolithography is larger than (l3−Δl). Further, even if the overlay is small, the charge storage electrodes can be formed by etching in order to remove an edge of the electrode B'.

Figure 5A:
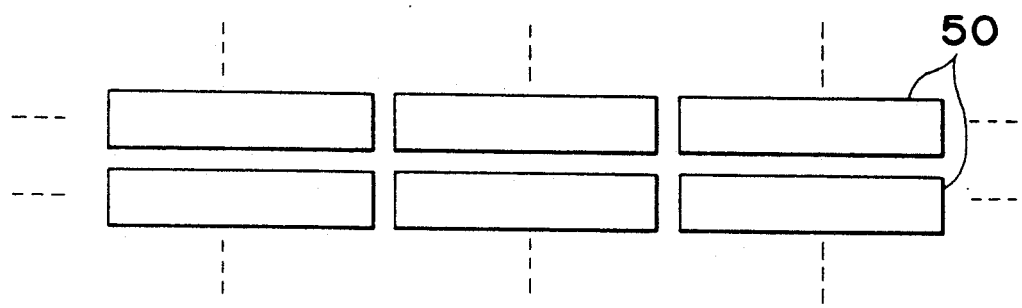
FIGS. 5(a) and 5(b) are schematic plan views for showing the arrangement of pairs of memory cells.
Figure 5B:
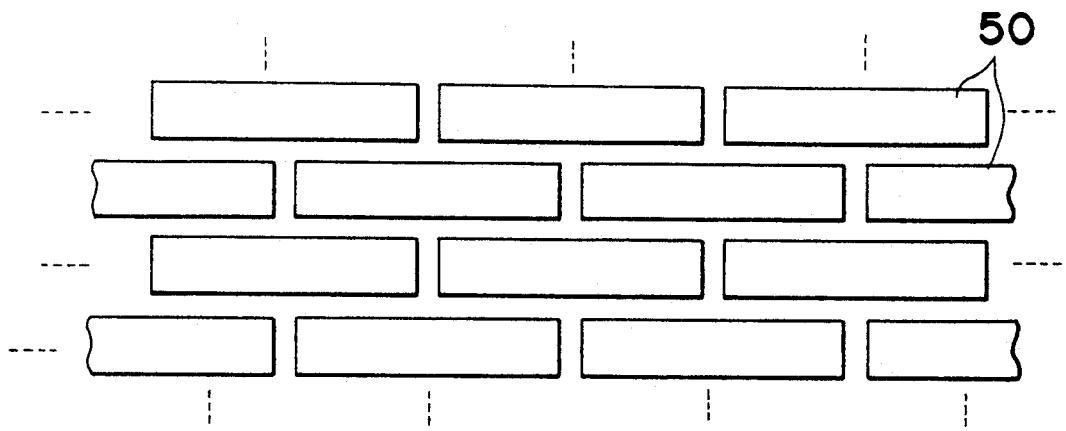

FIGS. 5(a) and 5(b) show two arrangements of charge storage electrodes in a cell array. Adjacent charge storage electrodes A' and B' are included in a rectangular region 50. In the case shown in FIG. 5(a), rectangular regions 50 are arranged similarly in each line, while in a case shown in FIG. 5(b), they are arranged in shifted alternating arrays.

In this structure, if the area of memory the cell is 1.8 μm², the height of the charge storage electrode A' is 0.5 μm, and the thickness of the insulating film is 6 nm, the capacitance of charge storage electrode B' is 45 fF.

FIGS. 6(a)-6(i) show the manufacturing method of a semiconductor memory device according to the present invention. FIG. 6(a) is a sectional view along the X-Y line in FIG. 6(b). First, after an element separation film 3 is formed on a semiconductor substrate 7, source regions 1 and drain regions 2 and word lines 4 are formed. Further, an interlayer film 5 and a silicon nitride film 6 of 100 nm thickness are successively formed. Though not shown explicitly, bit electrodes are also formed. Then, contact holes 10 of 0.4 μm square are formed for connecting the source regions 1 to charge storage electrodes. A contact hole for connecting the charge storage electrode A' is designated as 10A, while that for connecting the charge storage electrode B' is designated as 10B. Next, a polycrystalline silicon 11 is deposited over the whole surface, including the contact holes 10. Then, the thickness of the polycrystalline silicon 11 is etched to 0.1 μm. Next, after a high temperature oxide (HTO) film 12 of 0.7 μm thickness is formed on the whole surface, the region displayed by solid lines in FIG. 6(b) is removed with dry etching by using a resist mask (not shown) to form trenches 13 for forming the charge storage electrode A' of memory cell A. The length (of a size l1 of the mask) of the trenches 13 is shorter by 2*ΔL, twice the precision ΔL of overlay in photolithography, than the distance l2 between the two contacts 10B and 10C existing at every other site. In this embodiment, the length (l1) of a trench 13 is 3.35 μm, and Δl is 0.125 μm.

As shown in FIG. 6(c), after of a polycrystalline silicon layer of 50 nm thickness has been deposited on the whole surface, an amount in correspondence to the height of the film 12 is removed by using anisotropic dry etching to leave polycrystalline silicon 14 at the side surfaces of the trenches 13. It is to be noted that the bottom of the trench 13 is also formed with polycrystalline silicon 11.

Then, as shown in FIG. 6(d), the HTO film 12 is removed with wet etching wherein the polycrystalline silicon layer 11 is used as an etching stopper.

Next, as shown in FIG. 6(e), after an HTO film of 0.1 μm thickness is deposited on the entire surface, anisotropic dry etching of the HTO film is performed over the entire surface to form an HTO film 15 around the charge storage electrodes A' of memory cells A and in regions enclosed by the charge storage electrodes A'.

Figure 6F:
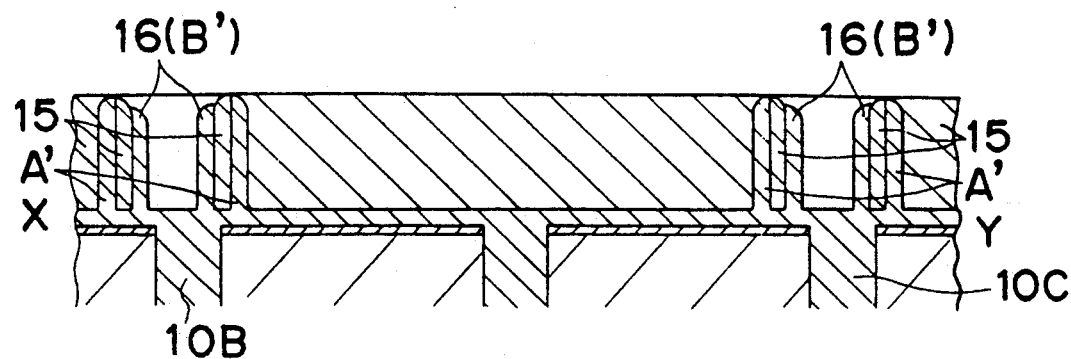

Then, as shown in FIG. 6(f) after of a polycrystalline silicon film 16 of 50 nm thickness has been deposited, anisotropic dry etching of the film 16 is performed over the entire surface to form charge storage electrodes B' of memory cells B.

Figure 6G:
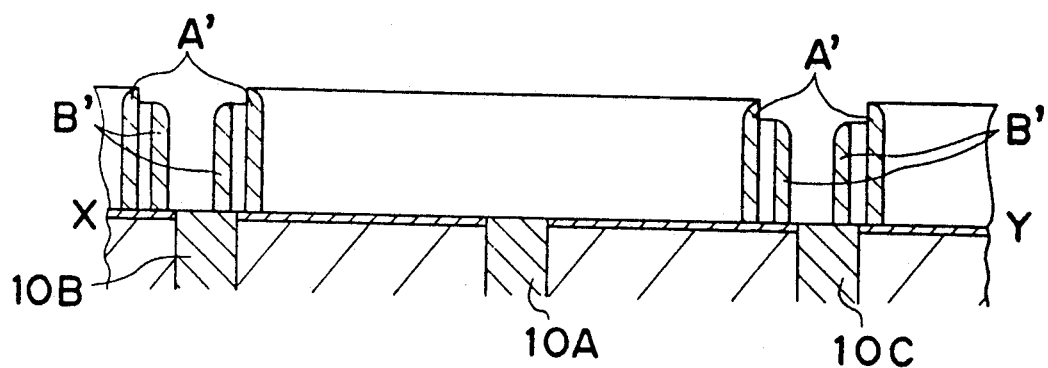

Next, as shown in FIG. 6(g), after the HTO film 15 is removed with wet etching by using the polycrystalline silicon 11 as an etching stopper, the polycrystalline silicon 11 is removed by 0.1 μm with anisotropic dry etching over the entire surface in order to separate the charge storage electrodes A' and B' of memory cells A and B completely. In the embodiment shown in FIG. 6(g), a shift of 0.1 μm arises on the position of the trenches 13. The connecting regions of the charge storage electrodes A' of memory cells A along the Z-W line (note FIG. 6(b)) are shown in FIG. 6(h).

Figure 6H:
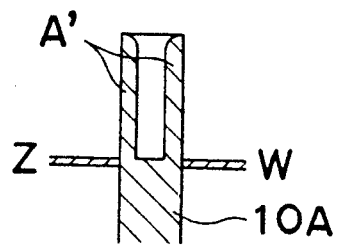
Figure 6I:
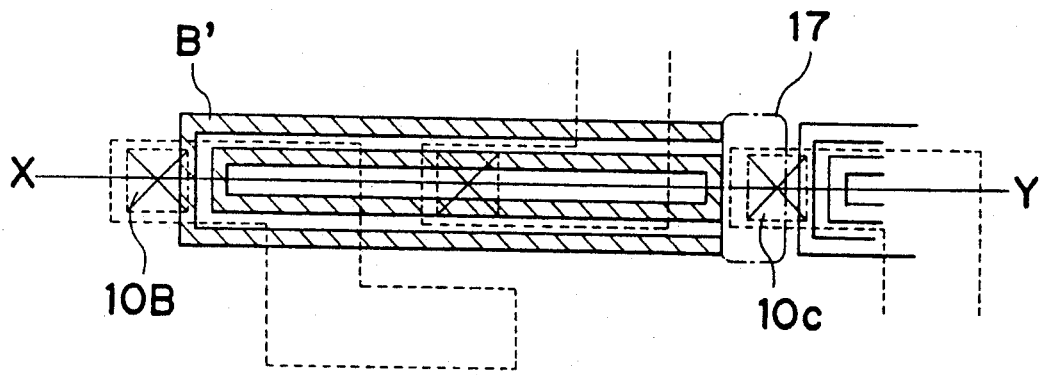

If a shift does not arise in the position of the trenches, or the shift is 0.025 μm or less, regions 17 of the polycrystalline silicon 16, displayed by a dash and dot line, making contact with the contacts 10C are removed with isotropic dry etching as shown in FIG. 6(i). However, if a shift of the overlay larger than 0.25 μm arises, the process shown in FIG. 6(i) is not needed, because the charge storage electrodes B' are connected only to either one of the alternate contacts 10B and 10C, and the charge storage electrode/substrate contact is formed with the use of the self-alignment.

Figure 6J:
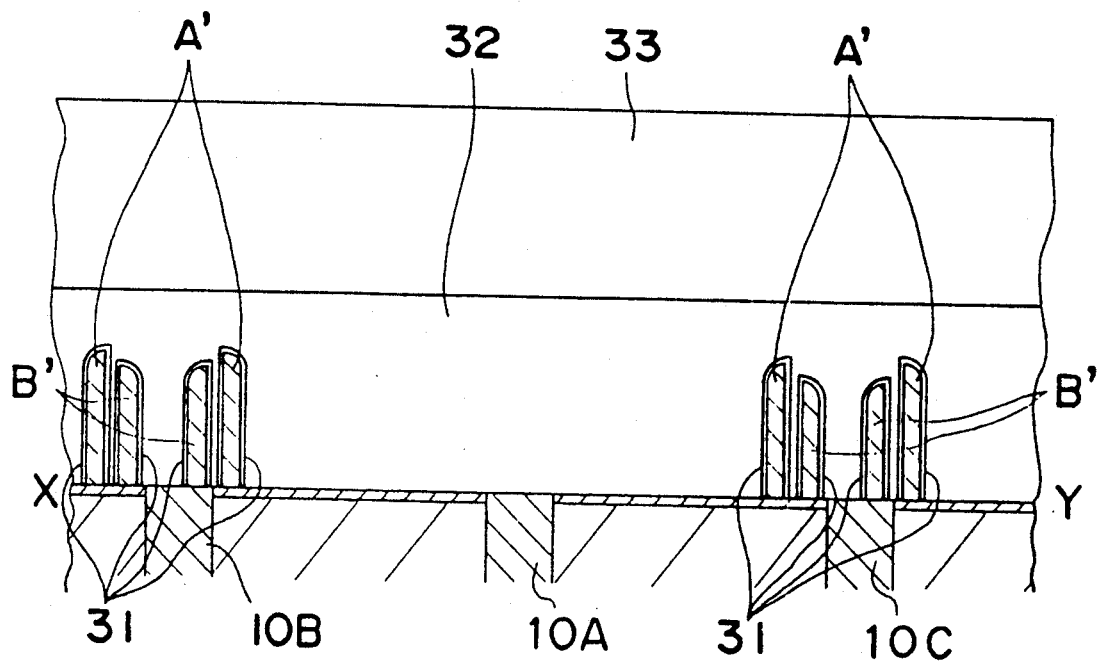

As shown in FIG. 6(j), after the charge storage electrodes A' and B' are formed as shown in FIGS. 6(g)-(i), capacitance oxide films 31 of 7 nm thickness of oxide-nitride-oxide film are formed on the charge storage electrodes A' and B'. Then, a plate electrode 32 is formed on the capacitance oxide film 31, and after the patterning of the plate electrode 32, a coating film 33 is formed on the plate electrode 32. Thus, a semiconductor device according to this embodiment is completed.

The HTO films 12 and 15 can be replaced by oxide films formed with chemical vapor deposition under normal pressure or under a reduced pressure.

The number of the steps in photolithography is the same as that of a prior art stack type DRAM.

Figure 7:
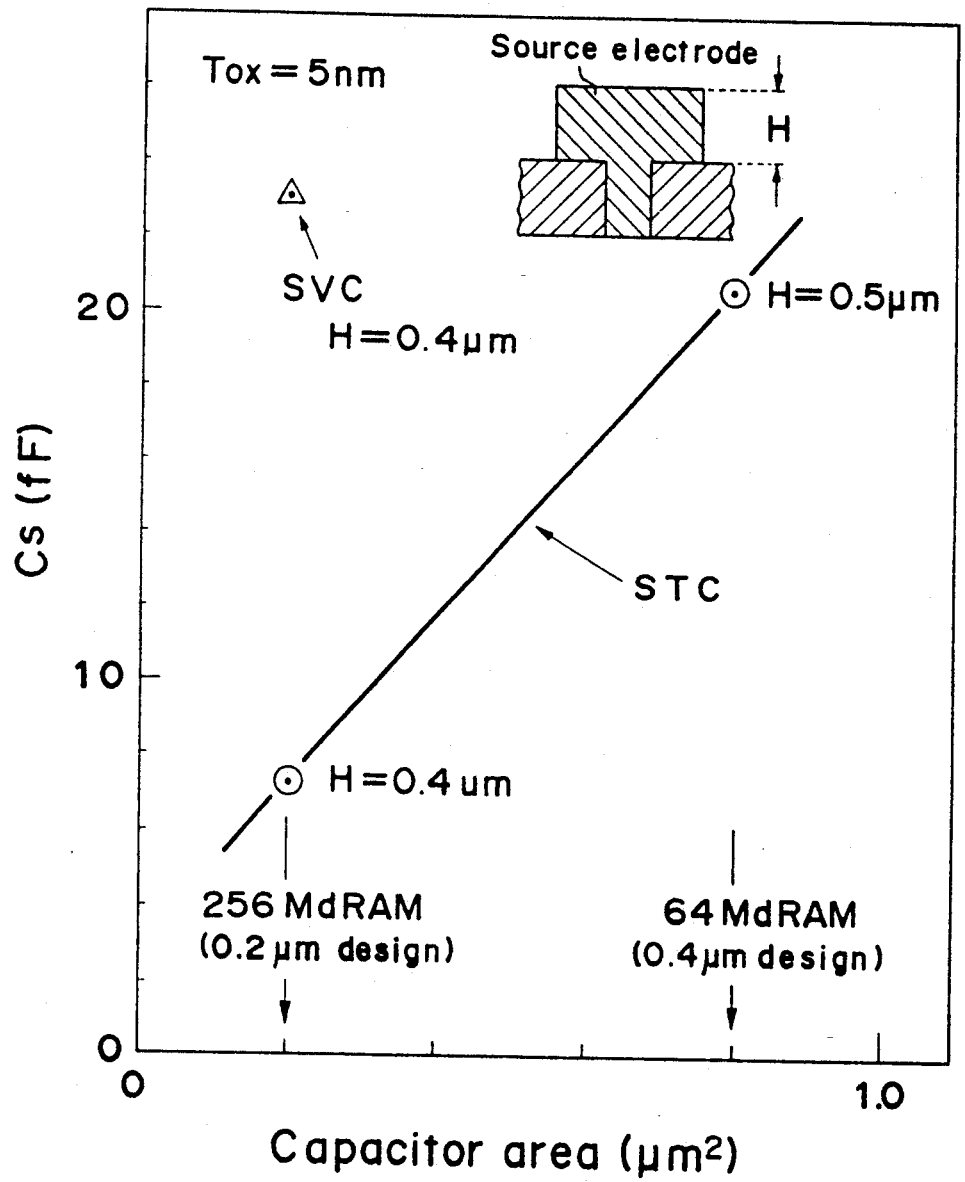
FIG. 7 is a graph of capacitance value (Cs) plotted against capacitor cell area.

A semiconductor memory device according to the present invention has the above-mentioned advantage due to the self-alignment. Further, it has an advantage explained below. FIG. 7 shows a relation of the cell capacitance (Cs) and the capacitor area (cell area) wherein SVC (spread-vertical-cell) designates a memory cell according to the present invention, while STC (stacked cell) designates a prior art stacked cell of the type shown in the inset of FIG. 7. In the inset, only a charge storage electrode (designated as source electrode) is displayed, and a capacitor film and a plate electrode successively applied to the upper surface of the source electrode are omitted for simplicity. In an SVC according to the present invention, the charge storage electrodes have the shapes of wall loops as shown in FIG. 1(a)-(c).

In an SVC according to the present invention, the capacitance value is proportional to the peripheral length of the capacitor plane region including two cells, while in a prior art STC, the capacitance value is proportional to the area of the capacitor region. The height H of the source electrode is 0.4 or 0.5 μm, as shown in FIG. 7. If an STC is shrinked from 64M to 256M, the capacitance value decreases in proportion to the area. If a capacitance shrinkage ratio is defined as a ratio of the capacitance value of 256M DRAM to that of 64M DRAM, the capacitance shrinkage ratio is not 0.25 (area shrinkage ratio), but 0.35, owing to the addition of the increase in the capacitance at the side wall of the source electrode. On the contrary, the capacitance value of an SVC of 256M DRAM according to the present invention is almost equal to that of an STC before shrinkage. The capacitance shrinkage ratio of SVC is 0.4, a little larger than the prior art STC, because the capacitance value is proportional to the peripheral length of the capacitor region. Thus, an STC of 256M DRAM according to the present invention has a capacitance about three times that of a prior art STC.

FIGS. 8-11 show the characteristics of an example of a semiconductor memory device (SVC) of this invention of 18 μm² cell area with use of a capacitance insulating film made of an oxide-nitride-oxide (ONO) film of 7 nm $SiO_2$ equivalent.

Figure 8:
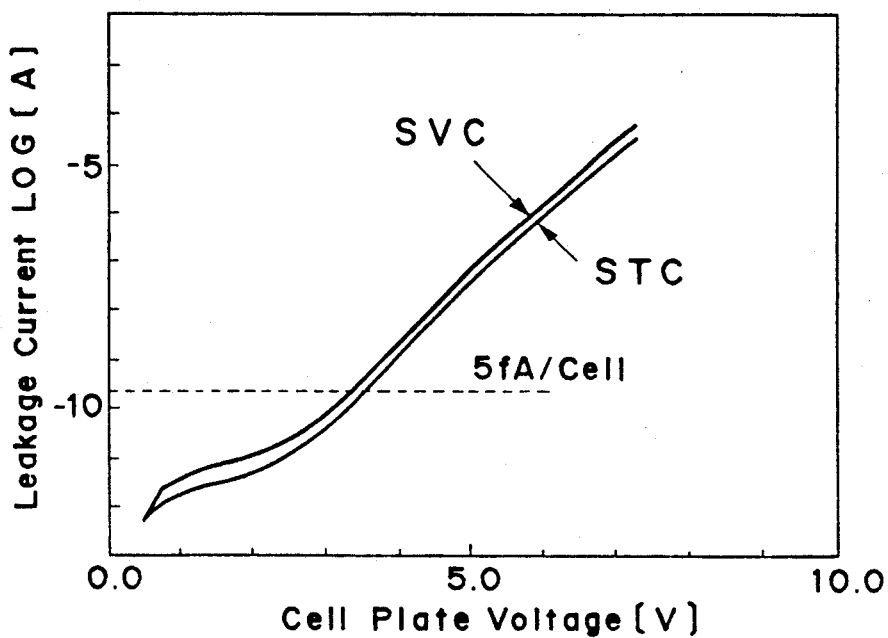
FIG. 8 is a graph of the current-voltage characteristic.

FIG. 8 shows the current vs. voltage characteristic of SVC, which is of the same order of a prior art STC and has no problem at the operating range (1.65 V) if the leak current cell is 5 fA.

Figure 9:
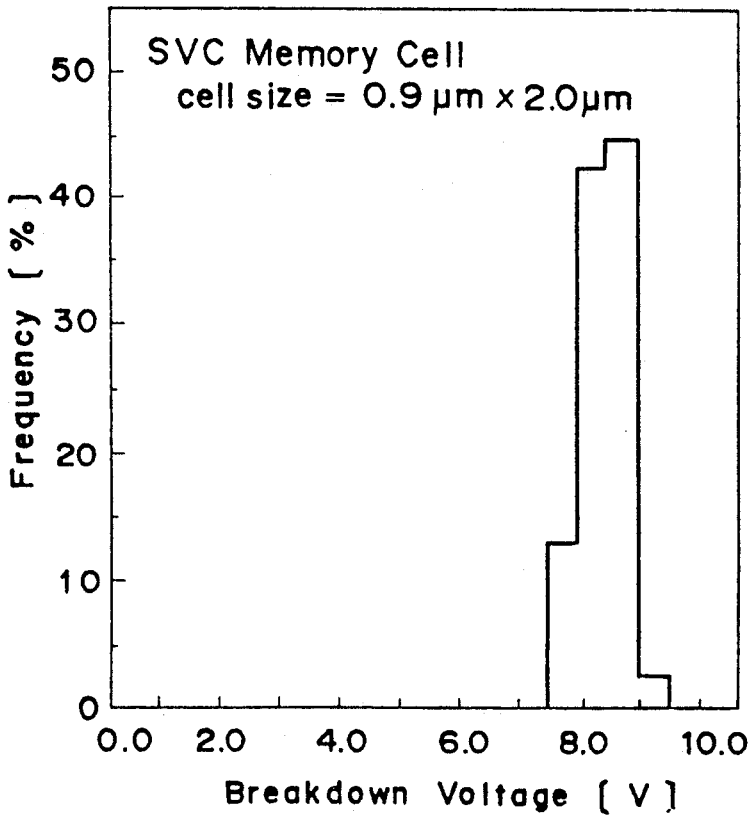
FIG. 9 is a graph of the breakdown voltage distribution of the semiconductor memory device according to the present invention.

FIG. 9 shows the breakdown voltage distribution of SVC of 0.9×2.0 μm² cell size. That the breakdown voltage is as high as 8.5 V is good.

Figure 10:
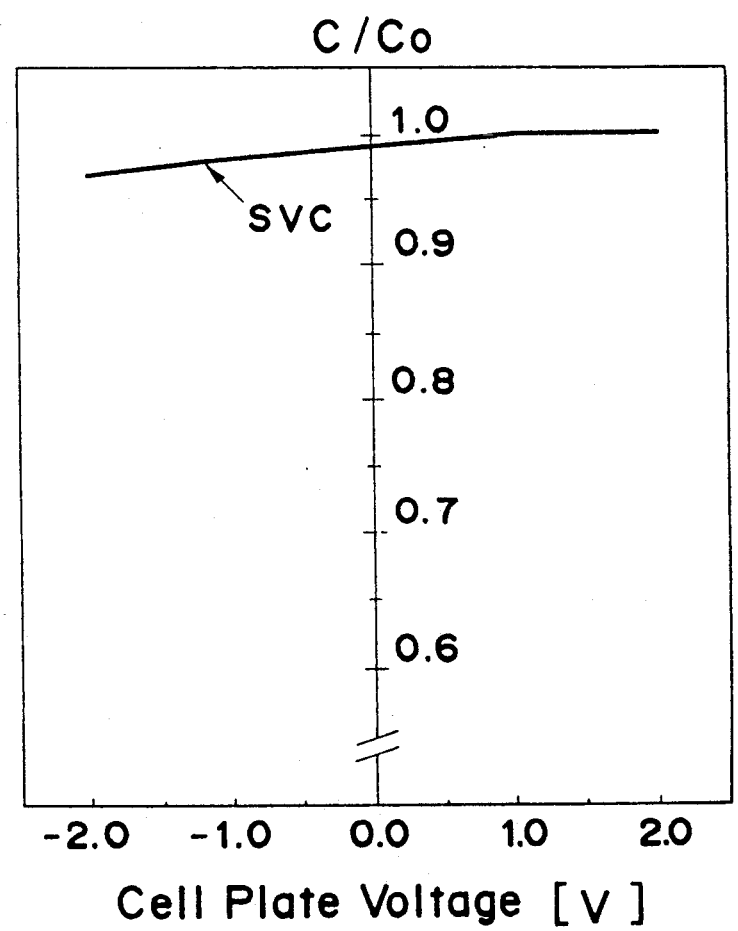
FIG. 10 is a graph of the capacitance cell plate voltage characteristic.

FIG. 10 shows the capacitance vs. cell plate voltage characteristic. The capacitance C is displayed as a value relative to that Co of zero cell plate voltage. The capacitance changes less than five percent in a range of +2 V to −2 V of cell plate voltage, and there is no problem.

Figure 11:
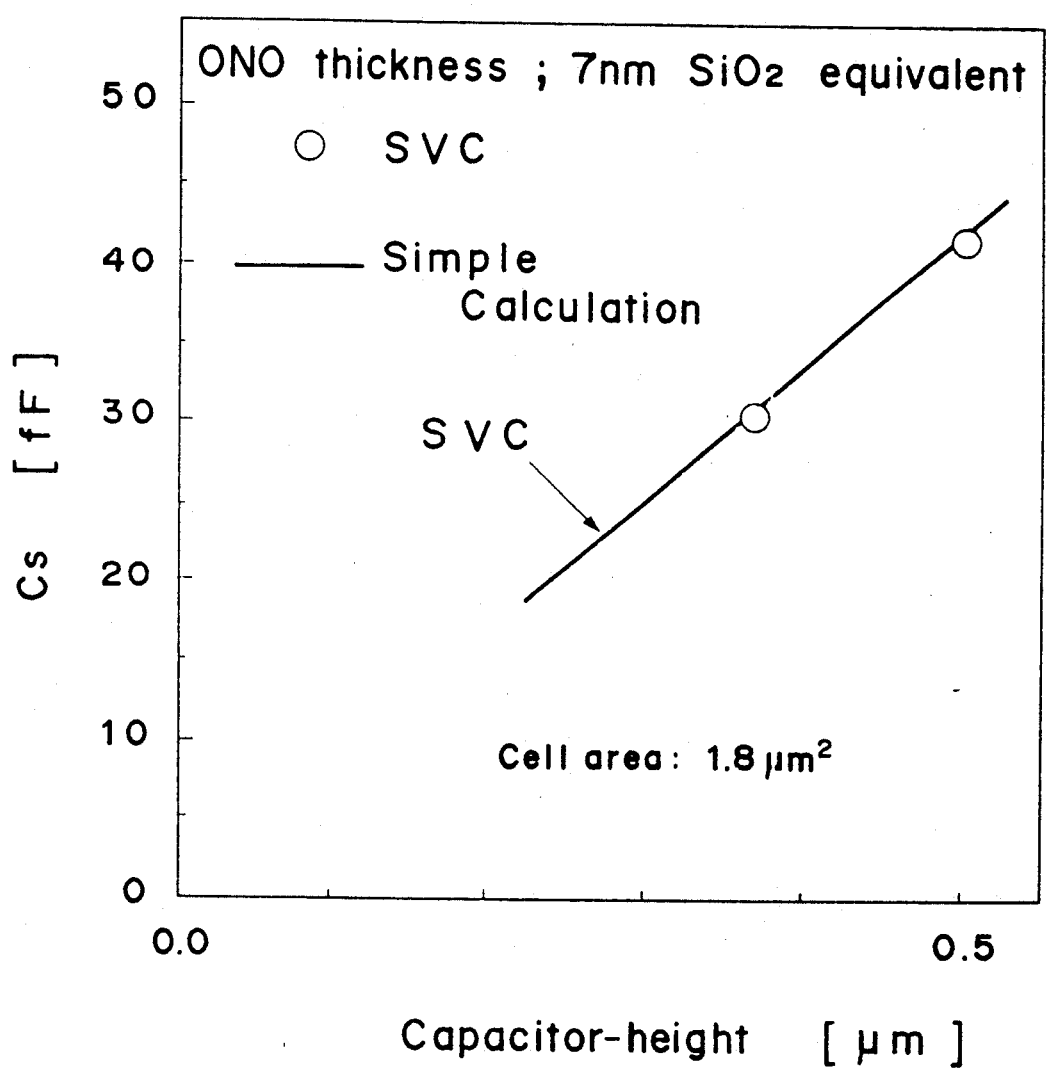
FIG. 11 is a graph of the capacitance-capacitor height characteristic.

FIG. 11 shows the capacitance vs. capacitor height characteristic. It is shown that the capacitance value $C_s$ is controlled by the capacitor height.

As explained above with reference to FIGS. 7-12, it is understood that a semiconductor memory device according to the present invention has good characteristics.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A semiconductor memory device including a semiconductor substrate having a primary surface, said semiconductor memory device having a plurality of memory cells, each said memory cell comprising:
   a switching transistor on said substrate, said switching transistor including a gate electrode connected to a word line, a drain electrode region connected to a bit line and a source electrode region; and
   a capacitor for storing information charges, said capacitor comprising a charge storage electrode connected to said source electrode region by a contact, said charge storage electrode extending perpendicularly to said primary surface of said substrate;
   said memory cells being arranged into pairs of adjacent memory cells;
   wherein the charge storage electrode of the capacitor of one memory cell of each adjacent pair of memory cells, viewed in a plane parallel to said primary surface, is in the shape of an at least partial loop surrounding the charge storage electrode of the capacitor of the other memory cell of each adjacent pair of memory cells.

2. The semiconductor memory device of claim 1, wherein the charge storage electrode of the capacitor of said one memory cell defines a closed loop completely surrounding the charge storage electrode of the capacitor of said other memory cell.

3. The semiconductor memory device of claim 1, wherein the charge storage electrode of the capacitor of said one memory cell defines an open loop only partially surrounding the charge storage electrode of the capacitor of said other memory cell.

4. The semiconductor memory device of claim 1, wherein the charge storage electrodes of the capacitors of said one memory cell and said other memory cell are each in the form of a rectangle when viewed in a plane parallel to said primary surface.

* * * * *